United States Patent
Cooper et al.

(10) Patent No.: US 9,731,971 B2
(45) Date of Patent: Aug. 15, 2017

(54) METHODS FOR THE PRODUCTION OF ALIGNED CARBON NANOTUBES AND NANOSTRUCTURED MATERIAL CONTAINING THE SAME

(71) Applicant: Multipure International, Las Vegas, NV (US)

(72) Inventors: Christopher H. Cooper, Sante Fe, NM (US); Hai-Feng Zhang, Winchester, MA (US); Richard Czerw, Clemmons, NC (US)

(73) Assignee: Multipure International, Las Vegas, NV (US)

( * ) Notice: Subject to any disclaimer, the term of this patent is extended or adjusted under 35 U.S.C. 154(b) by 0 days.

(21) Appl. No.: 14/844,399

(22) Filed: Sep. 3, 2015

(65) Prior Publication Data

US 2015/0376011 A1 Dec. 31, 2015

Related U.S. Application Data

(63) Continuation of application No. 14/209,358, filed on Mar. 13, 2014, now abandoned, which is a
(Continued)

(51) Int. Cl.
*D01F 9/12* (2006.01)
*D01F 9/127* (2006.01)
(Continued)

(52) U.S. Cl.
CPC ......... *C01B 31/024* (2013.01); *B01J 37/0215* (2013.01); *B01J 37/0217* (2013.01);
(Continued)

(58) Field of Classification Search
CPC .................................................. C01B 31/022
(Continued)

(56) References Cited

U.S. PATENT DOCUMENTS

| 7,160,531 B1* | 1/2007 | Jacques | B82Y 30/00 423/447.1 |
| 7,744,793 B2* | 6/2010 | Lemaire | B82Y 30/00 118/729 |

(Continued)

FOREIGN PATENT DOCUMENTS

WO 03072497 A1 9/2003

OTHER PUBLICATIONS

Han, et al., "Growth and emission characteristics of vertically well-aligned carbon nanotubes grown on glass substrate by hot filament plasma-enhanced chemical vapor deposition.," Journal of Applied Physics, vol. 88, No. 12, pp. 7363-7365, (2000).
(Continued)

*Primary Examiner* — Daniel C McCracken
(74) *Attorney, Agent, or Firm* — Greenberg Traurig, LLP; Todd C. Basile

(57) ABSTRACT

Disclosed herein is a scaled method for producing substantially aligned carbon nanotubes by depositing onto a continuously moving substrate, (1) a catalyst to initiate and maintain the growth of carbon nanotubes, and (2) a carbon-bearing precursor. Products made from the disclosed method, such as monolayers of substantially aligned carbon nanotubes, and methods of using them are also disclosed.

5 Claims, 9 Drawing Sheets

System for the continuous production of surface-grown carbon nanotubes.

Related U.S. Application Data continuation of application No. 12/026,868, filed on Feb. 6, 2008, now Pat. No. 8,709,374.

(60) Provisional application No. 60/899,868, filed on Feb. 7, 2007.

(51) Int. Cl.

| | |
|---|---|
| *B82Y 30/00* | (2011.01) |
| *B82Y 40/00* | (2011.01) |
| *C01B 31/02* | (2006.01) |
| *B01J 37/02* | (2006.01) |
| *C23C 16/26* | (2006.01) |
| *C23C 16/50* | (2006.01) |
| *B01J 23/745* | (2006.01) |
| *D01F 9/133* | (2006.01) |

(52) U.S. Cl.
CPC ........... *B01J 37/0238* (2013.01); *B82Y 30/00* (2013.01); *B82Y 40/00* (2013.01); *C01B 31/0233* (2013.01); *C23C 16/26* (2013.01); *C23C 16/50* (2013.01); *B01J 23/745* (2013.01); *C01B 2202/08* (2013.01); *C01B 2202/34* (2013.01); *C01P 2004/13* (2013.01); *D01F 9/133* (2013.01)

(58) Field of Classification Search
USPC ........ 423/447.1–447.3, 445 B; 977/742–754, 977/842–848
See application file for complete search history.

(56) References Cited

U.S. PATENT DOCUMENTS

| | | | | |
|---|---|---|---|---|
| 7,850,778 | B2 * | 12/2010 | Lemaire | ................ B82Y 30/00 118/715 |
| 8,162,643 | B2 * | 4/2012 | Lemaire | ................ B82Y 30/00 156/502 |
| 2007/0092431 | A1 * | 4/2007 | Resasco | ................ B01J 23/882 423/447.3 |
| 2007/0237959 | A1 | 10/2007 | Lemaire | |
| 2008/0018012 | A1 | 1/2008 | Lemaire et al. | |
| 2010/0244307 | A1 | 9/2010 | Lemaire et al. | |

OTHER PUBLICATIONS

Liu, et al., "Continuous Production of Carbon Nanotubes by Using Moving Bed Reactor", Chinese Chemical Letters, vol. 12, No. 12, pp. 1135-1138, (2001).
International Search Report from International Patent Application No. PCT/US2008/001538.

* cited by examiner

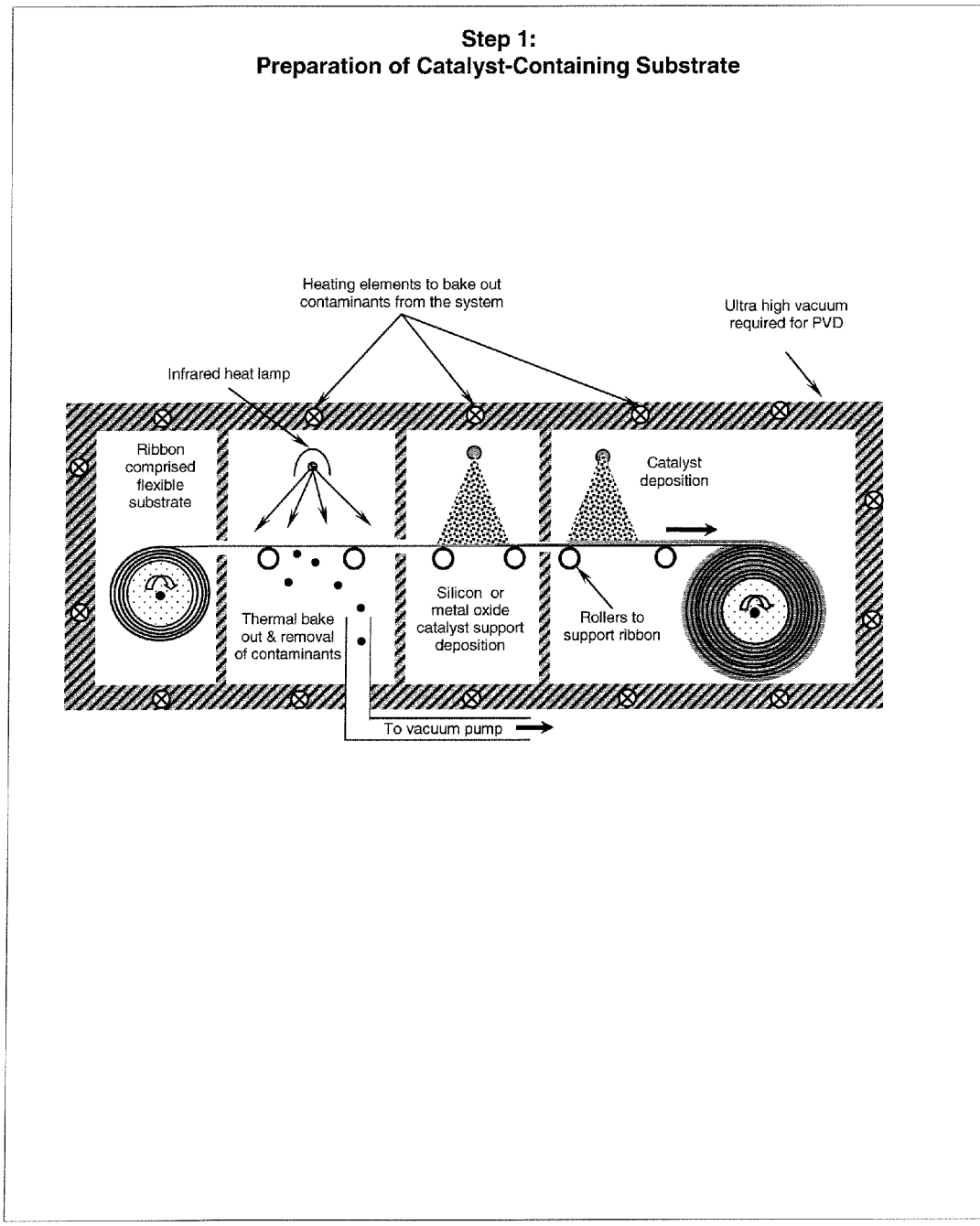
Figure 1: System for treating growth substrate prior to carbon nanotube growth.

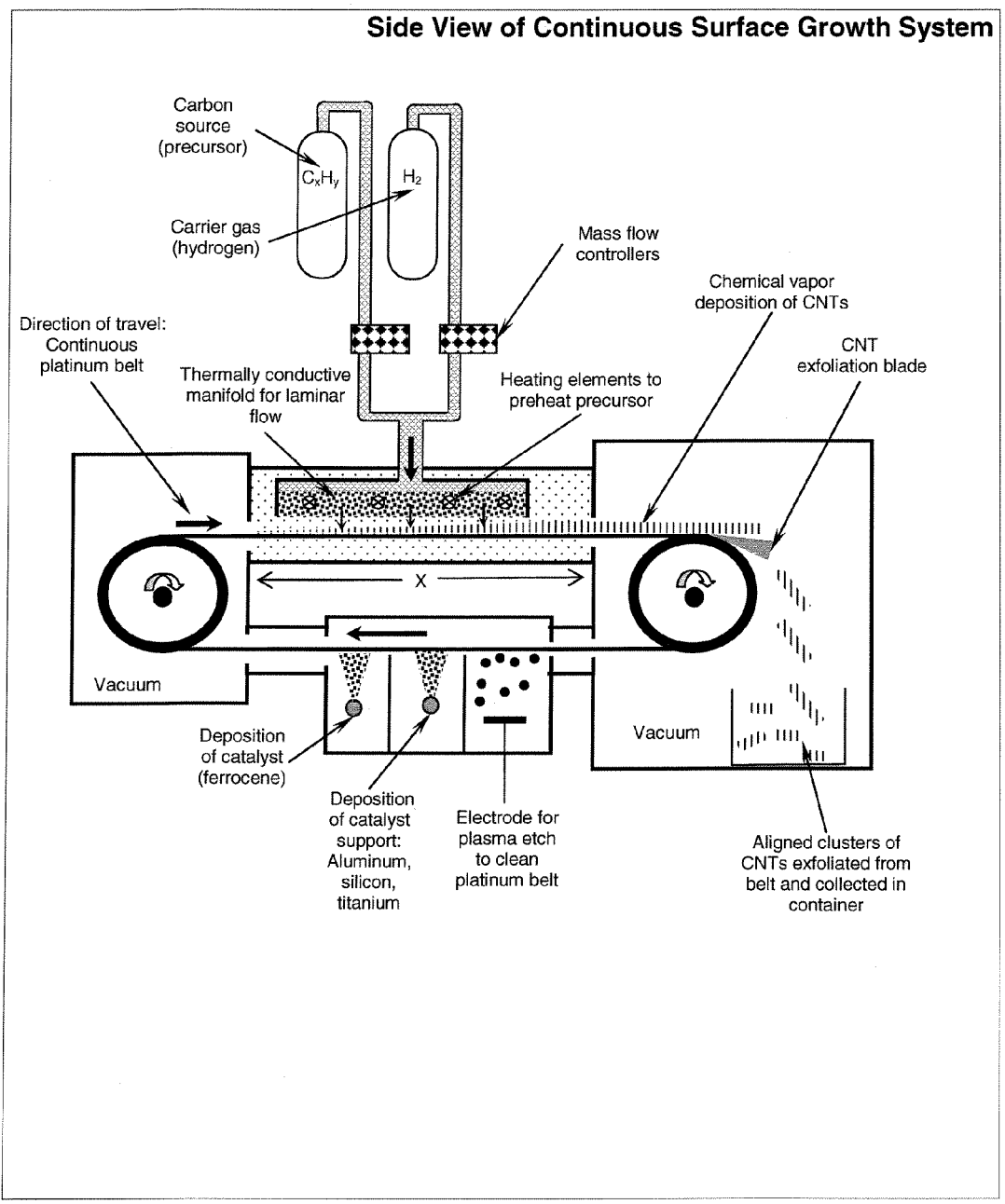
Figure 2: System for the continuous production of surface-grown carbon nanotubes.

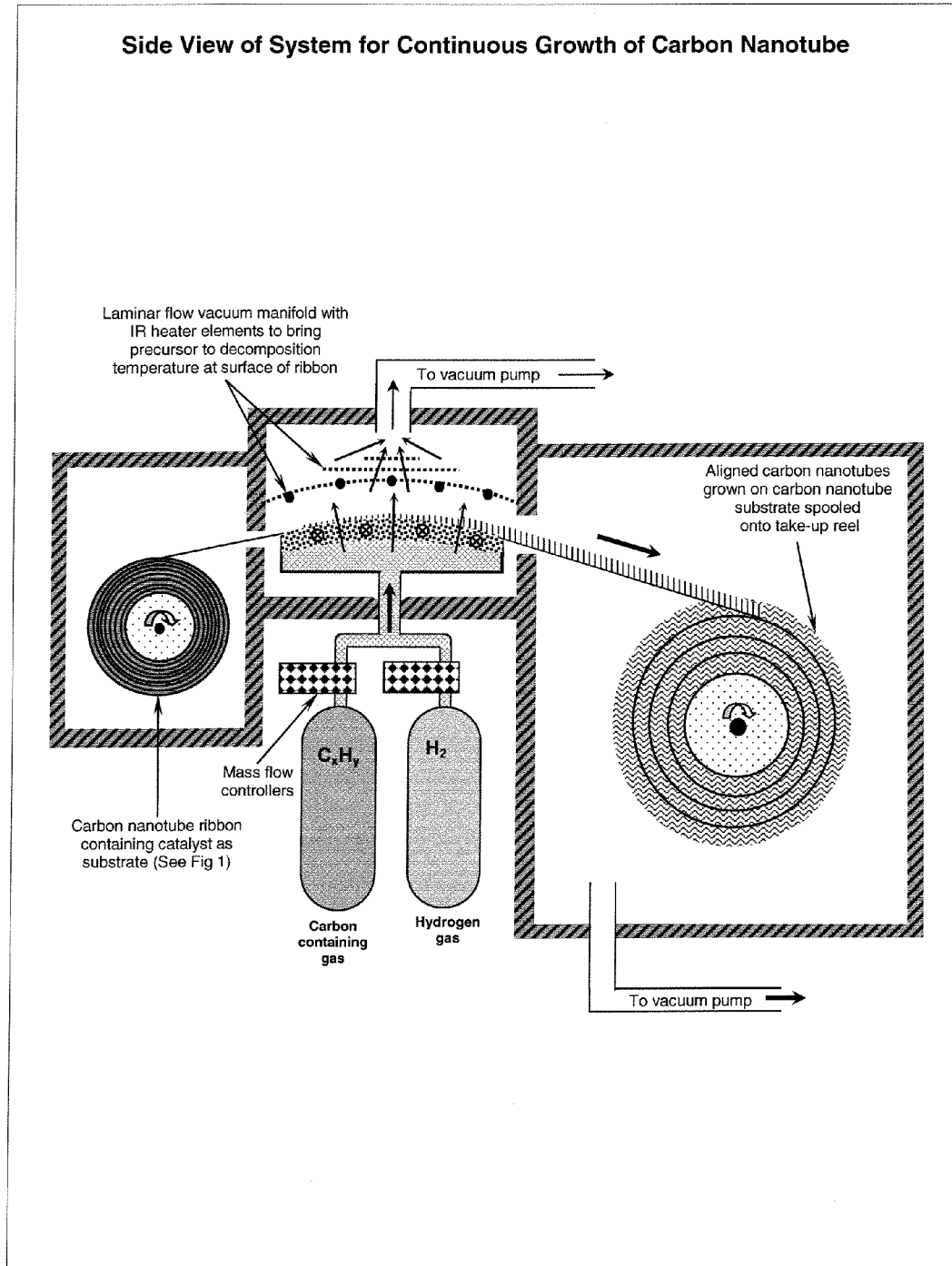
Figure 3: System for the continuous growth of carbon nanotubes using laminar flow of precursor gas.

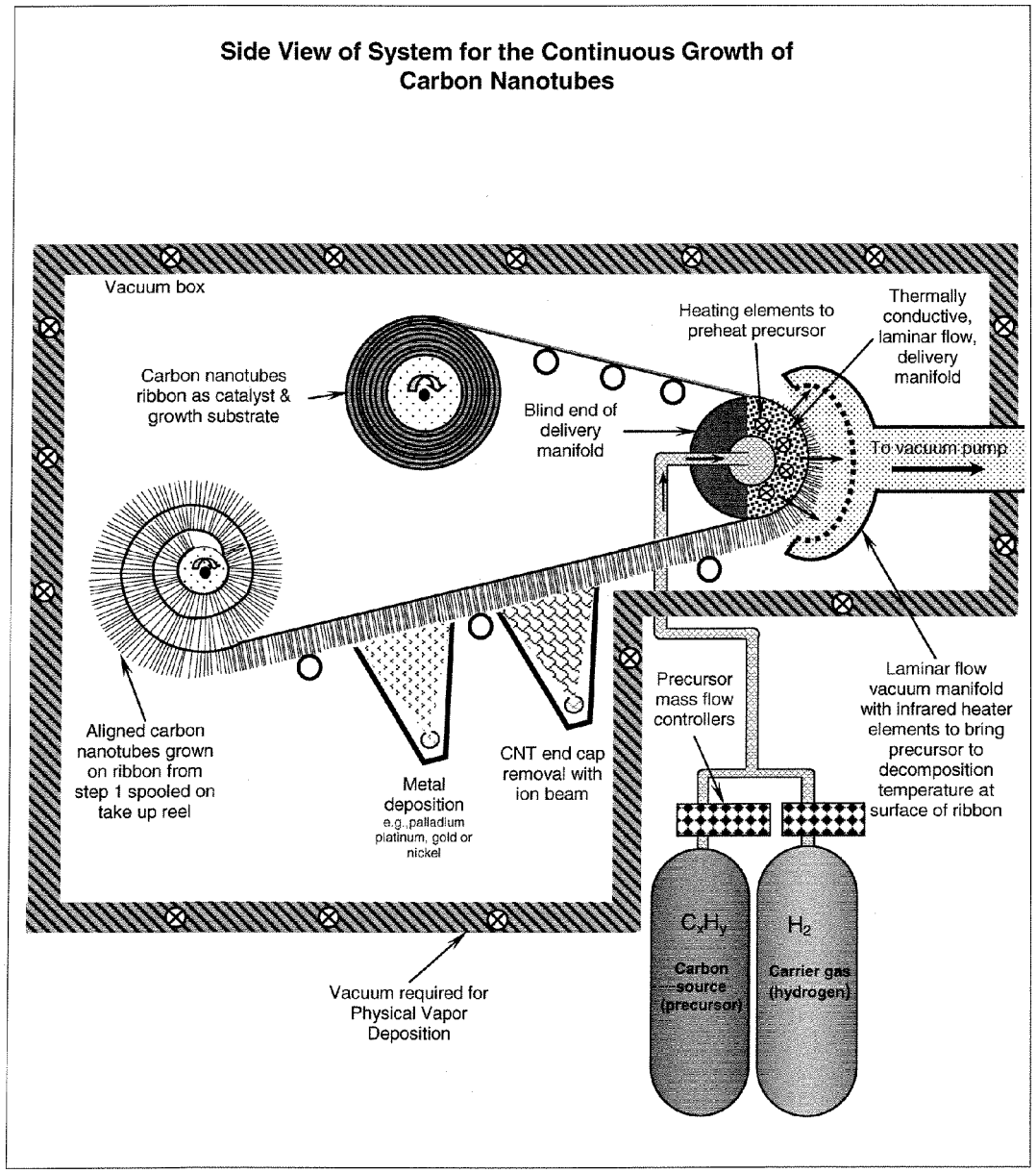
Figure 4: System for the continuous growth of carbon nanotubes on a carbon nanotube substrate.

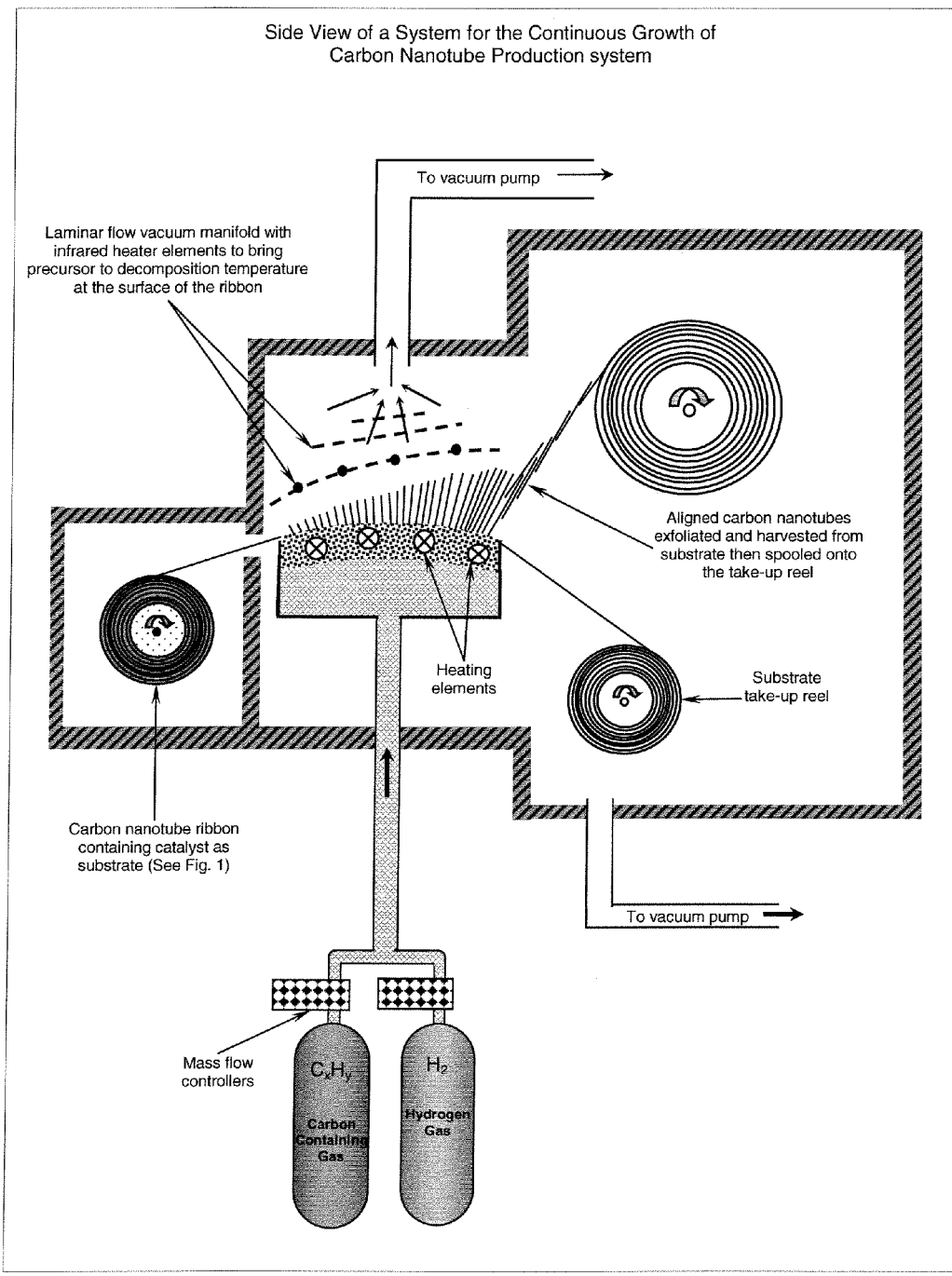
Figure 5: System for the continuous growth and exfoliation of CNTs from a substrate.

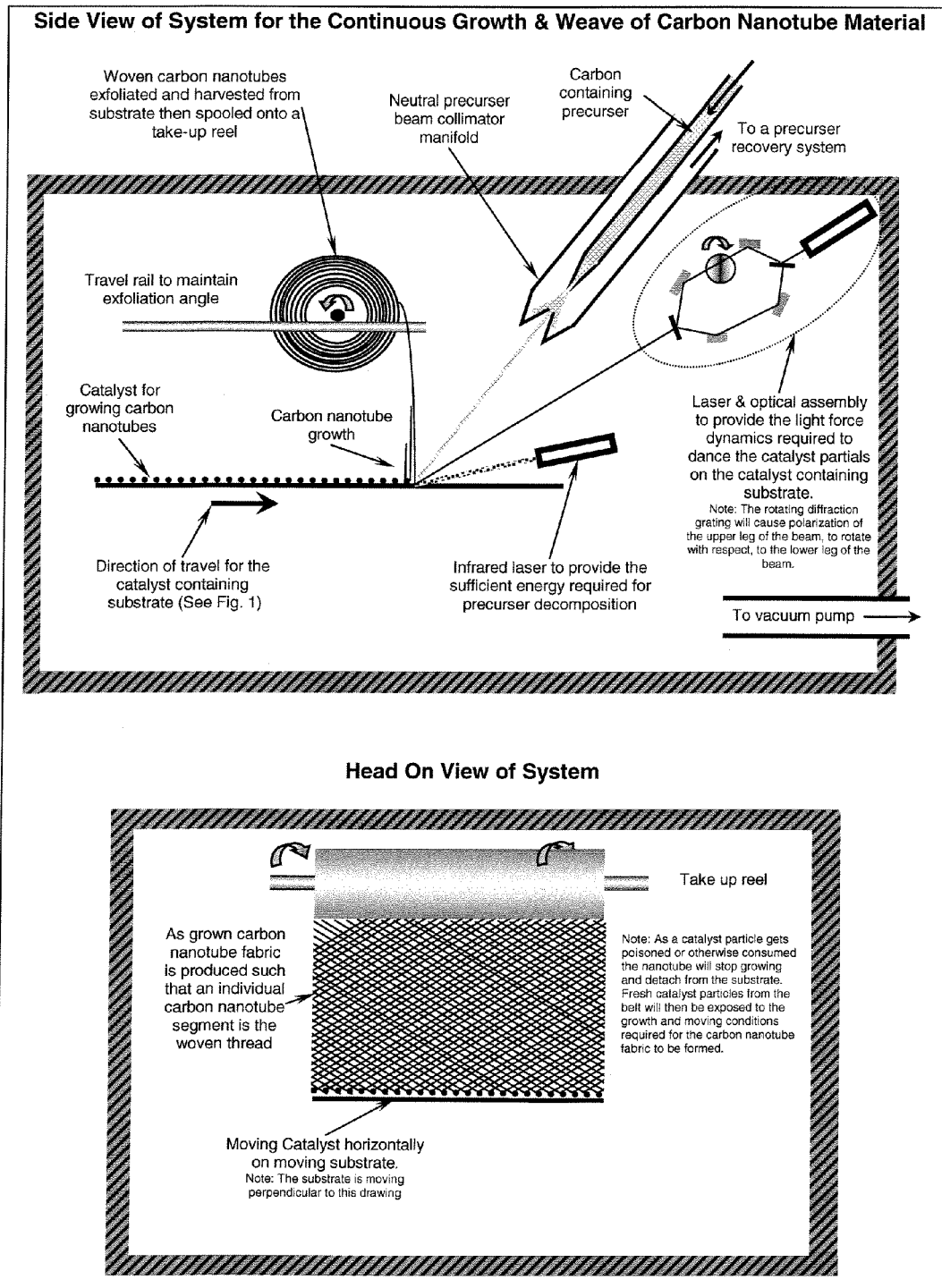
Figure 6: Side View of System for the Continuous Growth & Weave of Carbon Nanotube Material

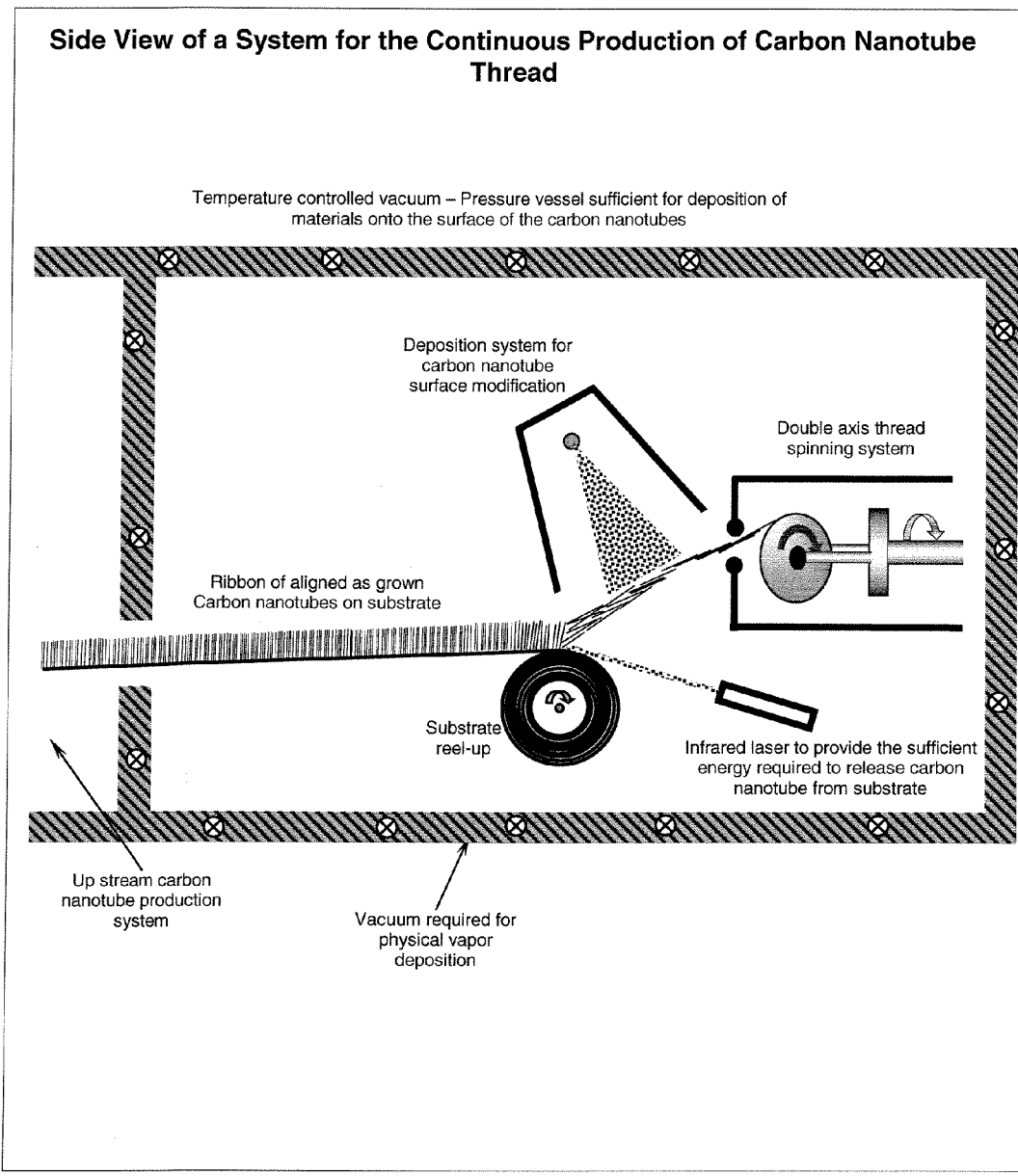
Figure 7: System for producing coated and spun carbon nanotube thread.

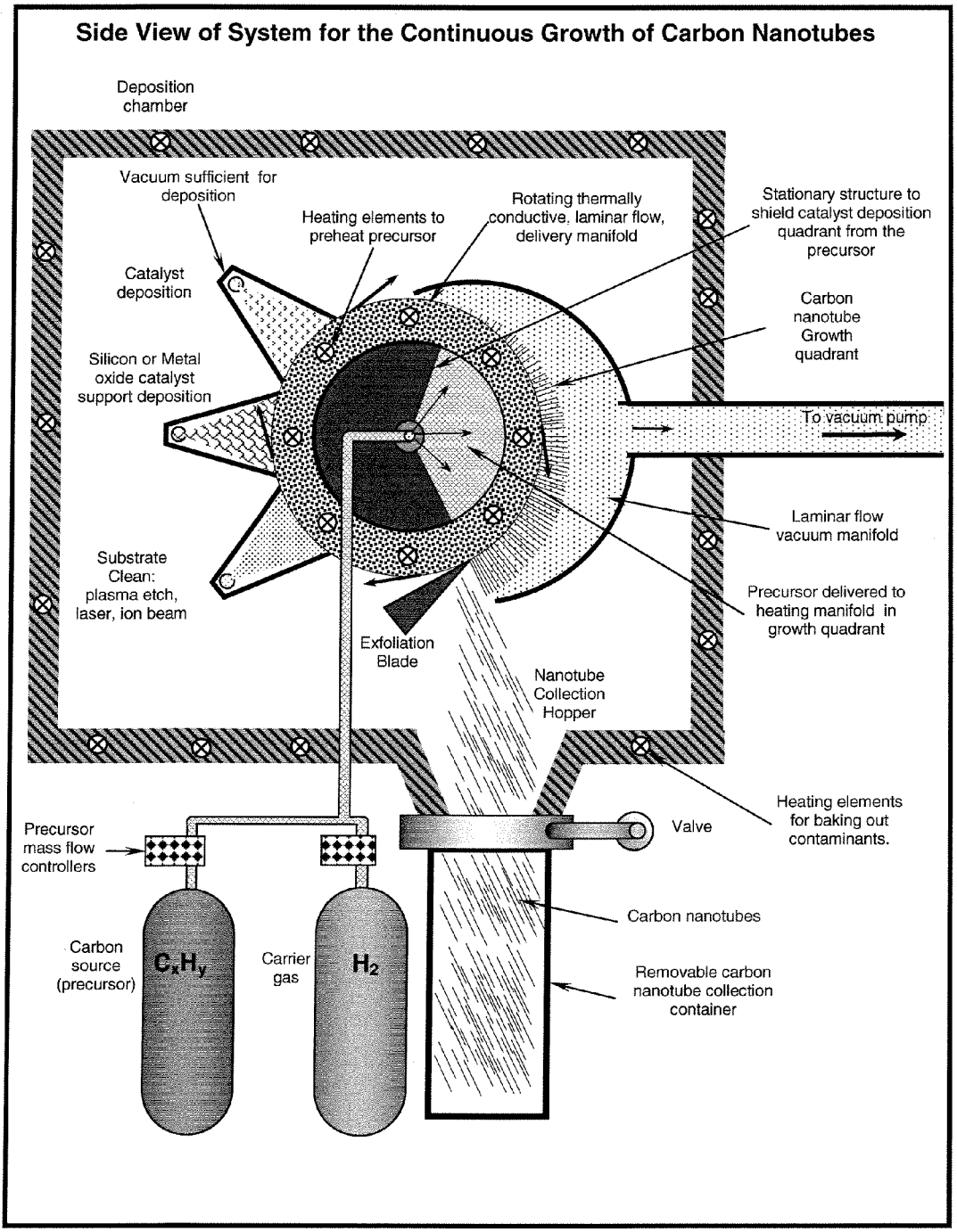
Figure 8: System for the continuous growth of carbon nanotubes on a rigid rotating drum.

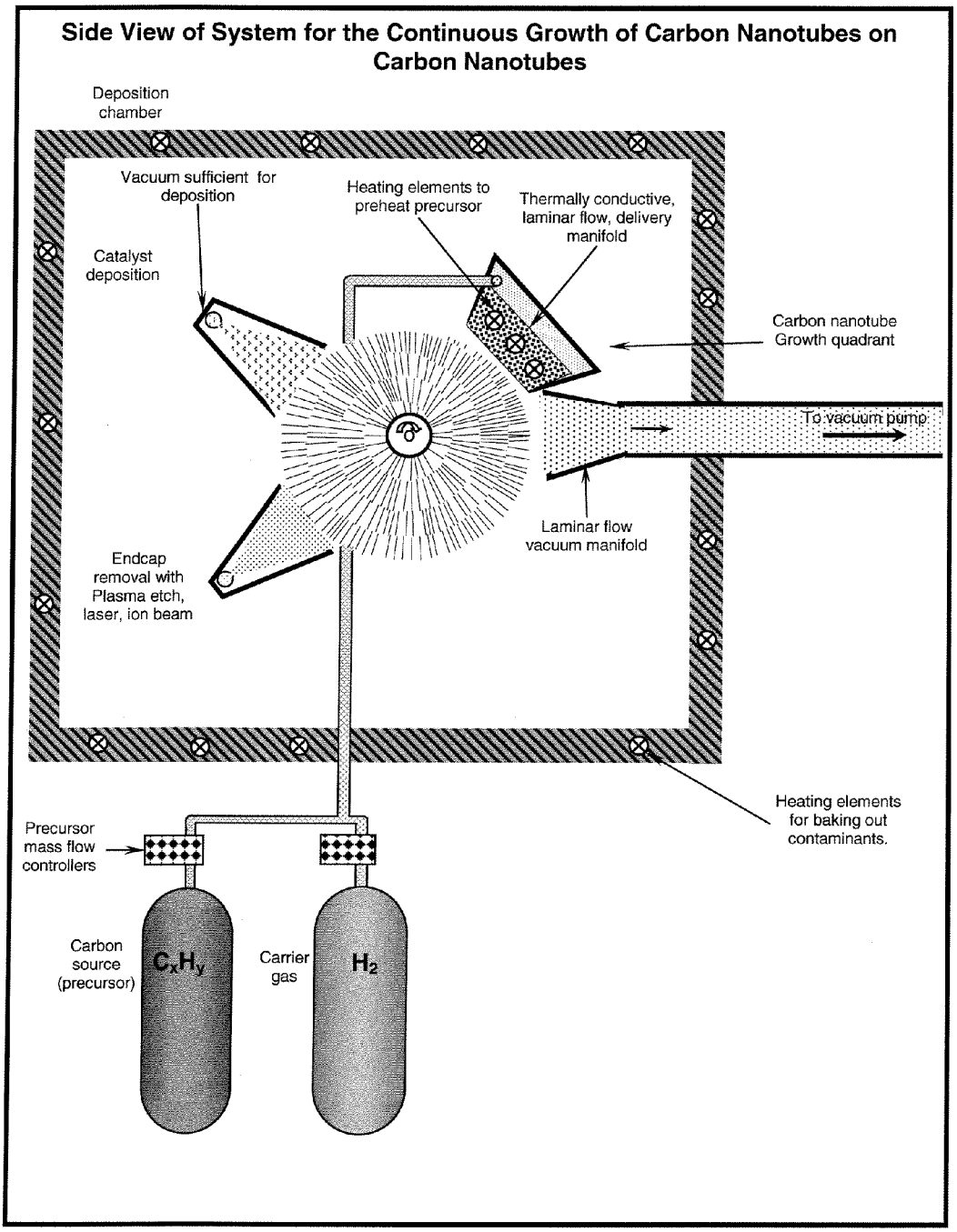
Figure 9: System for the continuous production of tip growth carbon nanotubes by reseeding catalyst on the open end of the carbon nanotube

METHODS FOR THE PRODUCTION OF ALIGNED CARBON NANOTUBES AND NANOSTRUCTURED MATERIAL CONTAINING THE SAME

This application is a continuation of 14/209,358, filed on Mar. 13, 2014 which is a continuation of 12/026,868, filed on Feb. 6, 2008, now U.S. Pat. No. 8,709,374, which issued Apr. 29, 2014, which claims the benefit of domestic priority to U.S. Provisional Patent Application No. 60/899,868, filed Feb. 7, 2007, the entire contents of each of these applications are hereby incorporated by reference.

The present disclosure relates to a continuous or semi-continuous method for making high volumes of aligned arrays of surface grown carbon nanotubes. The present disclosure also relates to the use of surface grown carbon nanotubes in nanostructured materials by interlinking, fusing, functionalizing, and or weaving them together to form high strength one, two and three-dimensional materials.

Aligned arrays of carbon nanotubes have many advantages over carbon nanotubes produced from gas phase or from powdered catalyst such as ease of dispersion orientation control, length of millimeters and beyond. Aligned arrays of carbon nanotubes have been produced and are commercially available, however, due to the batch nature of production of aligned carbon nanotubes the cost is still out of reach for many applications. Continuous or semi-continuous processes disclosed herein addresses the need for high volume production of aligned arrays.

The ability of the nanostructured material to have a wide-ranging density, for example ranging from 1 picogram/$cm^3$ to 20 $g/cm^3$, allows such material to be tailored for a wide variety of applications. Non-limiting examples of articles made from nanostructured material as described herein include fabrics, filters, and structural supports. Due to the highly desirable electrical, mechanical and thermal properties associated with many carbon nanotubes, the creation of interlaced nanostructured materials is possible. This interlacing would improve the structural integrity of the nanostructured material over those previously available, and would significantly improve the efficiency of mechanical actuators, electrical wires, heat sinks, thermal conductors, or membranes for fluid purification.

Composite materials incorporating carbon nanotubes typically involve using carbon nanotubes as an additive, in amounts often ranging from 1-40 percent by weight. In many cases, such a loading of carbon nanotubes has improved performance properties of the final material at lower levels than other additives. While these compositions are well-suited to many applications, their low addition levels of carbon nanotubes partially mask the carbon nanotube's extreme performance characteristics, especially their mechanical strength, thermal transfer ability, electrical conductivity, liquid sterilization capacity, and other high surface area effects.

The high strength associated with carbon nanotubes, about 100 times the tensile strength of steel at $\frac{1}{6}^{th}$ the weight, allows the nanostructured material described herein to be used for puncture resistance applications, such as projectile bombardment or other ballistic mitigation applications. To further take advantage of the carbon nanotube's performance characteristics, it would be advantageous to design and construct a mostly carbon nanotube one, two and three-dimensional structure that has the inherent material strength to be useful commercially. Further, a process that creates a one, two and three-dimensional structure of interwoven carbon nanotubes in a simple process would allow the material properties of this material to be readily adjusted for strength, thickness, porosity, flexibility, and other properties. In particular, the nanostructured material described herein exhibits excellent blast mitigation properties, which may be defined in terms of energy adsorbed per unit impact area as a function of the mass of the affected composite material.

Accordingly, creating materials, such as a cloth, composites and threads, that comprises ultra-strong carbon nanotubes fused together to form a highly cross-linked network remains of high importance. The properties associated with such a material leads to a range of beneficial properties such as ultra-high tensile strength, low weight, acceptable flexibility, good thermal and electrical conductivity ideally suited for air frames and space craft.

Furthermore, given the acute need for materials with these characteristics in many applications there is a need for methods that produce these materials in a scaleable way. Accordingly, the present disclosure relates to a method for making surface grown carbon nanotubes in a more efficient way, and in higher volumes than currently available and to using such nanotubes in the fabrication of nanostructured materials or threads.

SUMMARY

The present disclosure is related to a continuous or semi-continuous method for producing a plurality of aligned carbon nanotubes, the method comprising depositing onto a moving or continuously moving substrate,
 (1) a catalyst to initiate and maintain the growth of carbon nanotubes, and
 (2) a carbon-bearing precursor, and
 growing nanotubes inside of a chemical vapor deposition (CVD) reactor at conditions that promote the growth of substantially aligned carbon nanotubes on the catalyst support material.

In one embodiment, the carbon-bearing precursor is preheated by a delivery manifold prior to being introduced into the CVD reactor. The carbon-bearing precursors may be chosen from a variety of compound, such as $CH_4$, $C_2H_4$, $C_2H_2$, $CO_2$, CO, and combinations thereof.

The movable or continuously moving substrate may comprise a flexible ribbon, ridged cylindrical, or ring, and may be made of a variety of materials, such as metals, alloys and oxides. For example, the substrate material may comprise platinum, palladium, iridium, iron, cobalt, nickel, chromium, carbon, silicon, aluminum, magnesium carbon, combinations, alloys or oxides thereof. It is understood that these materials may be found in the form of fibers, fabrics, mesh, sheets, wafers, cylinders, or plates.

The method according to one embodiment further comprises depositing a catalyst promotion material prior to depositing the catalyst material. In this embodiment, the catalyst may be exposed to catalyst promotion material during carbon nanotube growth comprising. The catalyst promotion material may be chosen from sulfur, water vapor, hydrogen gas, deuterium gas, oxygen, fluorine, helium, argon, ammonium, nitrogen or combinations thereof.

In one embodiment, depositing at least one of (1) the catalyst to initiate and maintain the growth of carbon nanotubes, or (2) the carbon-bearing precursor is performed using laminar flow conditions. Non-limiting examples of methods used to deposit the carbon bearing precursor may be chosen from at least one technique chosen from chemical vapor deposition, plasma enhanced chemical vapor deposition, physical vapor deposition, plasma enhanced physical vapor deposition.

Additionally, the method may use an inert carrier gas for one of (1) or (2), such as argon, nitrogen, hydrogen, or any combination of such gases. Alternatively, the carrier gas may comprise a pure gas, such as pure argon, nitrogen, or hydrogen.

The substrate on which the plurality of aligned carbon nanotubes is deposited may be a flexible ribbon or ridged cylindrical material, comprised of a substance with sufficient thermally stability to survive the temperature of the carbon-bearing precursor decomposition. In is understood that conditions that promote the growth of substantially aligned carbon nanotubes include a temperature ranging from 600 to 1,100 degrees Celsius, and/or a carbon bearing precursor at a flow rate per unit substrate surface ranging from 10 ml/(cm$^2$ min) to 400 ml/(cm$^2$ min).

In one embodiment, the catalyst is comprised of iron, cobalt, nickel, platinum, lead, palladium, copper, gold, or any combination or alloy thereof. While not required, such catalysts may comprise particles having diameter ranging from 0.7 nm and 50 nm.

It is also appreciated that carbon nanotubes made according to the present disclosure may have lengths ranging from 100 um to 20 cm. Thus, the continuously moving substrate may be moved at a speed sufficient to produce these lengths.

In another non-limiting embodiment, there is disclosed a method for producing substantially aligned carbon nanotubes, that comprises depositing onto a semi-continuous or continuously moving substrate:
  (1) a catalyst to initiate and maintain the growth of carbon nanotubes, the catalyst comprising iron, cobalt, nickel, platinum, lead, palladium, copper, gold, or any combination or alloy thereof; and
  (2) a carbon-bearing precursor at a flow rate per unit substrate surface ranging from 10 ml/(cm$^2$ min) to 400 ml/(cm$^2$ min),
  growing nanotubes inside of a chemical vapor deposition (CVD) reactor at a temperature ranging from 600 to 1,100 degrees Celsius.

It is understood that the substrate may comprise a flexible or rigid tape, wire, ribbon, cylindrical, or ring substrate of platinum, palladium, iridium, iron, cobalt, nickel, chromium, carbon, silicon, aluminum, magnesium carbon, combinations, alloys or oxides thereof.

The accompanying drawings, which are incorporated in and constitute a part of this specification, illustrate several embodiments of the invention and, together with the description, serve to explain the principles of the invention.

BRIEF DESCRIPTION OF THE DRAWINGS

FIG. 1. is a schematic of a system according to the present disclosure used to prepare a catalyst containing substrate.

FIG. 2. is a schematic of a system according to the present disclosure used to perform a continuous method for producing surface grown carbon nanotubes.

FIG. 3. is a schematic of a system according to the present disclosure used to perform a continuous method for producing surface grown carbon nanotubes via a laminar flow of gases to the growth substrate.

FIG. 4. is a schematic of a system according to the present disclosure used to perform a semi-continuous method for producing surface grown carbon nanotubes.

FIG. 5. is a schematic of a system according to the present disclosure used to perform a continuous method for growing, exfoliating and harvesting surface grown carbon nanotubes.

FIG. 6. is a schematic of a (a) side view of a system according to the present disclosure that uses a grow and weave method for the continuous growth of carbon nanotube containing material.

FIG. 7. is a schematic of a system according to the present disclosure used to perform a semi-continuous method for spinning surface grown carbon nanotubes into thread.

FIG. 8. is a schematic of a system according to the present disclosure used to perform a continuous method for producing and harvesting surface grown carbon nanotubes utilizing a single rotating drum.

FIG. 9. is a schematic of a system according to the present disclosure used to perform a continuous method for producing long or ultra-long carbon nanotubes by re-depositing a catalyst on the opened ends of the tubes.

DETAILED DESCRIPTION OF THE INVENTION

DEFINITIONS

The term "fiber" or any version thereof, is defined as an object of length L and diameter D such that L is greater than D, wherein D is the diameter of the circle in which the cross section of the fiber is inscribed. In one embodiment, the aspect ratio L/D (or shape factor) of the fibers used may range from 2:1 to $10^9$:1. Fibers used in the present disclosure may include materials comprised of one or many different compositions.

An "aligned array" refers to an arrangement of carbon nanotubes grown to give one or more desired directional characteristics. For example, an aligned array of surface grown carbon nanotubes typically, but not exclusively, comprise random or ordered rows of carbon nanotubes grown substantially perpendicular to the growth substrate. An example of an aligned array of carbon nanotubes is shown in FIG. 7. The common directional characteristic of such aligned arrays assist the carbon nanotubes in a subsequent fiber spinning process.

The prefix "nano-" (as in "carbon nanotubes") refers to objects which possess at least one dimension that are on a nano-scale (e.g., one billionth of a meter, $10^{-9}$ meters), such as on the atomic or molecular level. Nano-fiber will be known as a fiber whose diameter may be 0.4 nm to 500 nm. Carbon nanotubes described herein generally have an average diameter in the inclusive range of from 1-200 nm and an average length in the inclusive range of from 20 nm and up.

The terms "nanostructured" and "nano-scaled" refers to a structure or a material which possesses components having at least one dimension that is 100 nm or smaller. A definition for nanostructure is provided in *The Physics and Chemistry of Materials*, Joel I. Gersten and Frederick W. Smith, Wiley publishers, p382-383, which is herein incorporated by reference for this definition.

The phrase "nanostructured material" refers to a material whose components have an arrangement that has at least one characteristic length scale that is 100 nanometers or less. The phrase "characteristic length scale" refers to a measure of the size of a pattern within the arrangement, such as but not limited to the characteristic diameter of the pores created within the structure, the interstitial distance between fibers or the distance between subsequent fiber crossings. This measurement may also be done through the methods of applied mathematics such as principle component or spectral analysis that give multi-scale information characterizing the length scales within the material.

The term "nanomesh" refers to a nanostructured material defined above, and that further is porous. For example, in one embodiment, a nanomesh material is generally used as a filter media, and thus must be porous or permeable to the fluid it is intended to purify.

The term "leading edge" refers to the carbon nanotubes growing while at the edge of a forest where exfoliation from the surface is occurring.

"Defective carbon nanotubes" are those that contain a lattice distortion in at least one carbon ring. A lattice distortion means any distortion of the crystal lattice of carbon nanotube atoms forming the tubular sheet structure. Non-limiting examples include any displacements of atoms because of inelastic deformation, or presence of 5 and/or 7 member carbon rings, or chemical interaction followed by change in $sp^2$ hybridization of carbon atom bonds.

"Defective nano-fibers" are those that contain at least one lattice distortion along the crystalline structure of the nano-fiber.

An "impregnated carbon nanotube" is defined as a carbon nanotube that has other atoms or clusters inserted inside of the carbon nanotube.

A "functionalized" carbon nanotube is defined as a carbon nanotube that has bonded atoms or chemical groups to its surface.

A "doped carbon nanotube" is defined as a carbon nanotube that has the presence of atoms of an element other than that which comprises the majority of the carbon nanotube, within the carbon nanotube crystal lattice.

A "charged" carbon nanotube is defined as one that has a non-compensated electrical charge, in or on the surface of the carbon nanotube.

A "coated carbon nanotube" is defined as a carbon nanotube that is surrounded by or decorated with clusters of atoms other than that which comprises the majority of the carbon nanotube.

"Irradiated", "irradiation" is defined as the bombardment of carbon nanotubes or the nano-structured material with any form of radiation such as, but not limited to, particles, molecules or photons (such as x-rays) of energy sufficient to cause inelastic deformation to the crystal lattice of the carbon nanotube.

As used herein the term "fused," "fusion," or any version of the word "fuse" is defined as the bonding of carbon nanotubes at their point or points of contact. For example, such bonding can be Carbon-Carbon chemical bonding including $sp^3$ hybridization or chemical bonding of carbon to other atoms.

As used herein the term "interlink," "interlinked," or any version of the word "link" is defined as the connecting of carbon nanotubes into a larger structure through mechanical, electrical or chemical forces. For example, such connecting can be due to the creation of a large, intertwined, knot-like structure that resists separation.

As used herein, "cross link", "cross linked" or "cross linking" means that a chemical bond is formed between two or more nanotubes within the carbon nanotube nanostructured material.

As used herein "catalyst poisoning" refers to the creation of over-layers of carbon on the carbon nanotube catalyst thereby eliminating the ability of the catalyst to actively promote carbon nanotube formation. "Catalyst poisoning" can also refer to atoms or molecules that adsorb into the catalyst and impend its nanotube growth function.

"Chosen from" or "selected from" as used herein refers to selection of individual components or the combination of two (or more) components. For example, the nano-structured material can comprise carbon nanotubes that are only one of impregnated, functionalized, doped, charged, coated, and irradiated nanotubes, or a mixture of any or all of these types of nanotubes such as a mixture of different treatments applied to the nanotubes.

The following disclosure describes large-scale production methods for producing nanostructured material. To that end, there is disclosed at least one carbon nanotube species grown on or in at least one supportive material, with a force applied thereto, the force designed to form a nano-cloth that has enhanced physical, chemical and/or electromechanical properties.

In one embodiment, the entire structure is put through at least one iteration of at least one carbon nanotube species growth in the supporting material with subsequent stretching of the material. This stretching may be accomplished by applying tension to the material during the growth or to the post grown aligned array of at least one carbon nanotube species. Drawing the catalyst containing substrate under tension through the carbon nanotube growth zone has the advantage of maintaining intimate contact of the ribbon to the catalyst delivery manifold to maintain the necessary temperature and pressure profile of the carbon containing precursor gas to the catalyst containing substrate.

Non-limiting examples of a supportive material can be fibers, spheres, or other shapes formed from materials comprising, but not limited to, carbon, glass, quartz, graphite, metals, ceramics, diamond, and other common materials.

Further embodiments of the invention are directed towards a one, two and three-dimensional carbon nanotube structure composition formed from curing a structure, either chemically or physically, that is composed primarily of at least one carbon nanotube species. Non-limiting examples of curing methods are radiation, photochemical bonding, high temperature, high current, laser absorption, laser heating, chemical, or pressure induced mechanical curing.

Certain embodiments of this invention are directed towards fusing the entire created structure using either chemical or physical methods. For example, such methods may include radiation from infrared and other sources sufficient enough to break apart covalent bonds in at least one carbon nanotube species' structure and allow these broken covalent bonds to reform with nearby broken covalent bonds; photochemical bonding such as, but not limited to, breaking the fullerene end-caps at the end of the at least one carbon nanotube species without breaking the more stable bonds within the body of the at least one carbon nanotube species and allow reformation of these broken bonds to nearby broken bonds; and laser heating from such sources as, but not limited to, carbon dioxide lasers.

Further, non-limiting examples of these embodiments use bonding agents such as metals, ceramics, other carbon materials, and polymers. In these embodiments, these materials may be added during carbon nanotube construction or the carbon nanotubes may be treated or coated after construction with at least one material comprising a metal, a polymeric material, and/or a ceramic material during or after the formation of the nanostructured material. These materials may be added to provide specific physical, chemical or electro-mechanical properties to the nanomaterial. In some embodiments, these materials are coated on distinct layers of the overall material to form a polymer containing layer, a ceramic containing layer, a metal containing layer, or a combination of any or all of these layers.

In some embodiments, the carbon nanotubes may take a form chosen from hollow multi-walled carbon nanotubes, bamboo multi-walled carbon nanotubes, double-walled carbon nanotubes, single-walled carbon nanotubes, carbon nano-horns, carbon nano-spirals, carbon nanotube Y-junctions, or other carbon nanotube species.

The above described shapes are more particularly defined in M. S. Dresselhaus, G. Dresselhaus, and P. Avouris, eds. Carbon Nanotubes: Synthesis, Structure, Properties, and Applications, Topics in Applied Physics. Vol. 80. 2000, Springer-Verlag; and "A Chemical Route to Carbon Nanoscrolls, L. M. Viculis, J. J. Mack, and R. B. Kaner; Science 28 Feb. 2003; 299, both of which are herein incorporated by reference.

In one aspect of the invention, due to the controlling the formation conditions of the components of the nanostructured material, the resulting structure may comprise 5, 6 and 7-membered carbon rings at the intersection of two or more carbon nanotubes. These different ring structures can lead to distortions in the carbon nanotubes, which tend to aid in the formation of a self-assembling nanostructured material.

In any of the above-described methods, the starting carbon nanotubes generally contain residual catalytic particles that remain after production of the nanotubes. In certain embodiments, it may be desired to treat the carbon nanotube material with a strong oxidizing agent such as acids and/or peroxides or combinations thereof in order to remove the catalytic particle impurities.

Some embodiments use bonding agents such as metals, ceramics, other carbon materials, and polymers to improve the physical, chemical and/or electro-mechanical properties of the nano-material. The polymers, ceramics, and/or metals, which may be included in the nano-material, may be in a form chosen from fibers, beads, particles, wires, sheets, foils, and combinations thereof. In these particular embodiments, the agents are added after the construction of the carbon nanotube material by treating, coating or by using layer by layer techniques with at least one material comprising a metal, a polymeric material, a ceramic material, carbon fiber, carbon nanotubes, diamond, activated carbon, graphite, poly-electrolytes or other carbon material common to the art during or after the formation of the nanostructured material.

Non-limiting examples of polymers that can be used in the nanostructured material described herein are chosen from single or multi-component polymers including nylon, acrylic, methacrylic, epoxy, silicone rubbers, natural rubbers, synthetic rubbers, vulcanized rubbers, polypropylene, polyurethane, polycarbonates, polyethylene, aramids (i.e. KevJar® and Nomex®), polystyrene, polychloroprene, polybutylene terephthalate, poly-paraphylene terephtalamide, polyesters [e.g. poly(ethylene terephthalate), such as Dacron®], polyester ester ketone, polytetrafluoroethylene (i.e. Teflon®), polyvinyl acetate, poly (p-phenylene terephtalamide), polyvinylchloride, viton fluoroelastomer, polymethyl methacrylate (i.e. Plexiglass®), and polyacrylonitrile (i.e. Orlon®), and any combination thereof Non-limiting examples of ceramics, ceramic-like, and other materials that can be used in the nanostructured material described herein include: silicon oxide, silicon nitride, silicon carbide, titanium oxide, titanium carbide, titanium nitride, titanium boride, magnesium oxide, boron carbide, boron nitride, zirconium oxide, zirconium carbide, zirconium boride, zirconium nitride, aluminum oxide, alumina, aluminum nitride, aluminum hydroxide, scandium oxide, hafnium oxide, hafnium boride, yttrium oxide, thorium oxide, cerium oxide, spinel, garnet, lanthanum fluoride, calcium fluoride, quartz, carbon and its allotropes, cordierite, mullite, glass, silicon nitride, ferrite, steatite, or combinations thereof.

Non-limiting examples of metals may be chosen antimony, arsenic, aluminum, selenium, zinc, gold, silver, copper, platinum, palladium, boron, nickel, iridium, rhodium, cobalt, osmium, ruthenium, iron, manganese, molybdenum, tungsten, zirconium, titanium, gallium, indium, cesium, chromium, gallium, cadmium, strontium, rubidium, barium, beryllium, tungsten, mercury, uranium, plutonium, thorium, lithium, sodium, potassium, calcium, niobium, magnesium, tantalum, silicon, germanium, tin, lead, or bismuth, yttrium, their oxides, hydrides, hydroxides, salts or any alloys thereof.

In this embodiment the metal may be deposited using traditional chemical methods or chemical or physical vapor deposition methods. Non-limiting examples of traditional chemical methods are salt decomposition, electrolysis coating, electro-coating, precipitation, and colloidal chemistry. Non-limiting examples of chemical or physical vapor deposition methods are metal organic chemical vapor deposition, electron sputtering, thermal sputtering, and/or plasma sputtering.

In one embodiment, at least one of the previously described polymers, ceramics, and metals are coated on the surface of the carbon nanotubes to form a polymer containing layer, a ceramic containing layer, a metal containing layer, or a combination of any or all of these layers.

Non-limiting examples of polymeric coatings added after construction of the nanomaterial are nitrocellulose, formaldehyde, melamine, epoxy, polyurethane, acrylic, urea, silicon, or combinations thereof. Further non-limiting examples of polymeric materials are polymeric linkages created by functional groups on the at least one carbon nanotube surface. Non-limiting examples of functional groups are carboxyl, amino-, chloro-, bromo-, fluoro-, epoxy-, isocyano-, thio-, or other polymeric linkages common to the art.

In some embodiments, other nanostructured fibers particles and/or other nano-scale particles may be added during nanomaterial formation to provide specific behaviors to the resulting nanomaterial. For example, quantum dots may be utilized to adjust and/or control the spectral absorption, reflection and emission characteristics of the nanomaterial for signature management applications.

It is possible, and in some circumstances desirable, to make a monolayer of carbon nanotube fabric. Alternatively, it is desirable to make a three dimensional nanostructured material using a sequence of processing steps to produce a woven carbon nanotube fabric. One non-limiting example of a sequence would be:
  (1) depositing a sacrificial substrate onto the first sector of a slowly rotating drum;
  (2) applying nano-particles of a catalyst, such as iron, to the substrate to initiate carbon nanotube growth;
  (3) growing, using for example, a Chemical Vapor Deposition (CVD) or Physical Vapor Deposition (PVD) process, a quasi-two dimensional mat of vertically-aligned carbon nanotubes. The length of these carbon nanotubes being controlled by the rotation rate of the drum, the temperature, pressure and the input rate of the feedstock gas; and
  (4) exfoliating the woven nanotube material/sacrificial substrate from the drum and feeding the exfoliated material as a continuous sheet into later stages of the fabric manufacturing device for post processing.

In this type of method, growing of the carbon nanotubes comprises the Chemical Vapor Deposition or Physical Vapor Deposition of catalyst. The process of applying the catalyst may comprise depositing a metal-organic catalyst layer, such as ferrocene or an iron pentacarbonyl containing layer. The process to grow carbon nanotubes typically requires a feedstock gas containing vapor to be in the presence of catalyst nano-particles at a temperature sufficient to produce carbon nanotube growth.

As shown in FIG. 1, one embodiment of the present disclosure is directed to treating the deposition substrate prior to growing carbon nanotubes. In this embodiment, the substrate may initially be heated, such as with an infrared lamp, to remove contaminants followed by depositing a catalyst support, such as a silicon oxide, prior to depositing the catalyst. It is appreciated that the atmosphere may be controlled depending on the type of deposition methods used for the catalyst support and catalyst. For example, when a chemical or physical vapor deposition method is used, the system can be exposed to a vacuum or ultra high vacuum.

In another embodiment, the method comprises a continuous method of making a one, two and three-dimensional nanostructured material, the method comprising:
(1) growing carbon nanotubes in situ;
(2) applying tension to direct the growth of the carbon nanotubes;
(3) interweaving the grown carbon nanotubes subsequent to the growing process and reeling them onto a spool; and
(4) treating the woven material, such as by fusing, annealing, chemical vapor deposition of materials onto the surface of the nanostructured nano-fiber material, physical vapor deposition of materials onto the surface of the nanostructured nano-fiber material, spraying, and/or pressing, to add specific performance characteristics to the nanomaterial.

With reference to FIG. 2, a continuous method for producing surface grown carbon nanotubes may employ a thermally conductive manifold for the laminar flow of the carbon precursor. This embodiment employs a rotating belt that permits treating of the deposition substrate (e.g., a platinum ribbon, carbon nanotube paper, or segmented plates of metal or quartz that have been joined to form a continuous belt) before depositing carbon nanotubes thereon. Treating the substrate may include a plasma etch or chemical clean to clean the surface prior to depositing a catalyst support, which may include an oxide of aluminum, silicon, and titanium. This embodiment further includes a exfoliation system, such as a blade, to remove the surface grown carbon nanotube from the substrate, as well as a container for collecting the exfoliated carbon nanotubes.

FIGS. 3 and 4 also show various systems for the continuous growth of carbon nanotubes using a different method that leads to a different product than that described in FIG. 2. For example, unlike FIG. 2, this embodiment utilizes a substrate (in these embodiments, carbon nanotubes) that already contains a catalyst and that will become an integral part of the finished product. Accordingly, a system according to these embodiments do not require a separate pre-treatment/catalyst deposition zone. Also, the system employs a take-up reel or mandrel for spooling the as-grown nanostructured material, rather than an exfoliation system, as used in FIG. 2.

FIG. 5 shows another inventive embodiment for the continuous growth of carbon nanotubes. This embodiment also uses an exfoliation system to remove the surface grown carbon nanotubes from the growth substrate, but which enables the carbon nanotubes to be gathered on a spool or mandrel as a continuous material, rather than as separate clusters.

It is appreciated that in any of the disclosed embodiments, the input rate of the feedstock gas and the reaction conditions may be precisely controlled, to a level previously unattainable, to direct the growth of the carbon nanotubes. In addition, either during or after a growth phase, directed tension may be applied to the forming carbon nanotubes to control their positions. Through this directed growth, a nano-weaving process may be enabled that allows for the creation of an ultra-high strength, woven nanomaterial.

As described, one beneficial aspect of the invention is the continuous nature of the production of aligned carbon nanotubes through the mechanical movement of catalyst through the carbon nanotube growth zone. This extremely precise control of all of the environmental and growth parameters enable the repeated fabrication of a highly reproducible material.

Another embodiment, which is illustrated in FIG. 6, is directed to a continuous method for making a one, two and three-dimensional nanostructured material comprising:
(1) depositing a movable or moving catalyst onto a substrate, such as a smooth substrate;
(2) moving the catalyst containing substrate into a carbon nanotube growth zone of a reactor to continually expose fresh catalyst to carbon containing precursor;
(3) growing carbon nanotubes from the catalyst;
(4) optionally applying sufficient tension to the woven sheet of carbon nanotubes at the leading edge to remove from the substrate; and
(5) treating the woven sheet, such as fusing, annealing, chemical vapor deposition of materials onto the surface of the nanostructured nano-fiber material, physical vapor deposition of materials onto the surface of the nanostructured nano-fiber material, spraying, and/or pressing, to add specific performance characteristics to the nano-material.

In another embodiment, the mechanical action of the carbon nanotubes removal from the growth substrate is performed slowly enough to deliver sufficient tension to cause the carbon nanotubes to grow longer before the carbon nanotubes come completely free from the growth substrate. The next row of carbon nanotubes will grab the row that was just removed due to van der Wals forces. The harvested nanotubes are aligned in-plane with the newly formed ribbon in near monolayer thickness. Materials may be deposited onto this thin near monolayer of carbon nanotubes.

In another embodiment, the thin film or spun fibers of carbon nanotubes are drawn from and simultaneously coated or functionalized from the as-produced ribbon of carbon nanotubes. As shown in FIG. 7, the coating or functionalization maybe accomplished with a physical vapor deposition process, or chemical ion deposition. Materials such as nickel and other lattices matching materials can form strong mechanical bonding to the graphene surface of a carbon nanotube. A carbon nanotube wire that is clad in metal is easily bonded to other metallic structures. By functionalizing the carbon nanotubes it is possible to crosslink them together with covalent bonding for enhanced strength. It is advantageous to accomplish post processing of the aligned array of carbon nanotubes prior to the exposure of the carbon nanotubes to atmospheric contaminates such as oxygen because oxygen in known to damage carbon nanotubes at elevated temperatures.

In certain embodiments of the present disclosure, the substrate may comprise a drum. For example, FIG. 8 shows a system similar to FIG. 2 for cleaning the surface prior to depositing a catalyst support, depositing oxide and catalyst except that a rotating, temperature-controlled drum is used instead of a belt.

The deposition substrate comprising a drum may be used to fabricate long or ultra-long carbon nanotubes. For example, FIG. 9 shows a rotating drum method for growing long carbon nanotubes by re-depositing the catalyst on the opened ends of the tubes, such as in the sublayer of the carbon nanotubes, and subsequently continuing growth of each tube. One optional embodiment of this method is directed to depositing a catalyst support layer in the form of an oxide and growing a "jelly roll" structure that can be removed from the drum at a later time.

In another embodiment the as-produced ribbon of carbon nanotubes may also be used as a contamination free growth substrate for a secondary or tertiary arrays of carbon nanotubes.

Further embodiments of the present invention are directed to methods for improving the material properties of a one, two and three-dimensional carbon nanotube structure, such as, but not limited to, physical and chemical curing methods. It will be apparent to one of ordinary skill in the art that certain embodiments of the present invention may be directed to some or all of these aspects of the present invention as well as other desirable aspects.

Because of the fine control over the design of the nanostructured material facilitated by the inventive method, a myriad of applications become possible. The ability to precisely control the location and nature of added functional chemical groups on individual carbon nanotubes along with the ability to interlace carbon nanotubes of differing chemical and physical composition allows for the creation of nano-fabrics with very specific physical properties that bond with specific chemical species.

Applications that require materials with specific physical properties will benefit from this invention. These include protective clothing (e.g. both ballistic and chemical agent protection, material reinforcement), actuators and motion control sensors (e.g. force sensitive fabrics), ultra-strength composites, high efficiency electrical devices (e.g. electrically conductive materials, thermally conductive materials, cold cathodes), energy applications (e.g. high-efficiency storage devices including batteries and super-capacitors, high-efficiency transmission, high magnetic field magnets).

Further, materials made according to the present disclosure can be used in applications that include any type of contaminant removal. These include particle containment, fluid filtration, fluid sterilization, desalinization, molecular sorting, pharmaceutical processing, petroleum refining, reusable gas super-absorbents, catalytic substrates.

In addition, there is described a device made from aligned carbon nanotubes or materials containing aligned carbon nanotubes made according to the disclosed method. For example, in one embodiment, there is disclosed microdevices or nano-devices include but are not limited to embedded solar cells, light emitting diodes, diodes, rectifiers, amplifiers, transistors, resisters, capacitors, inductors, lenses, reflectors, lasers, optical switches, electrical switches, batteries, antennae, integrated circuits, mass storage devices, sensors, micro-electro-mechanical systems (MEMS), nano-electro-mechanical systems (NEMS).

In one embodiment, the carbon nanotube material may be fabricated such that the described micro-devices or nano-devices are integrated together for the purpose of mechanically responding, transmitting power, transmitting information, transporting materials, transporting heat or any combination thereof.

In one aspect of the present disclosure, the nanostructured material comprises defective carbon nanotubes chosen from impregnated, functionalized, doped, charged, and/or irradiated. Such carbon nanotubes may be bound together or with other "support" materials.

In some embodiments, added support materials may be used to support the fabrication of the one, two and three-dimensional structure and/or may become an integral part of the structure. Alternatively, these materials may be sacrificial, meaning that they are removed by subsequent processing, such as thermal or chemical procedures, to eliminate them from the final structure, while leaving a stable structure comprised almost entirely of carbon nanotubes. The sacrificial support material may be used to assist in the exfoliation of the nanomaterial during production and/or may be used in applications that do not require the properties of the support material in the final product, such as in certain high strength or armor/ballistic applications, but may need it during production.

In any of the previously described methods, the carbon nanotubes may be grown with high temperature and/or high pressure bathing of a feedstock gas chosen from but not limited to: ethanol, carbon monoxide, carbon dioxide, xylene, acetylene, methane, ethane, supercritical noble gases, supercritical phases of metal-organics and metal-inorganics, and supercritical organo-silanes. Growth of the carbon nanotubes may be enhanced and controlled by depositing a metal-organic catalyst layer, such as ferrocene or iron pentacarbonyl.

In one non-limiting embodiment, the method could comprise the chemical or physical vapor deposition of at least one material chosen from previously described ceramics, metals, and polymers. During this method, deposition comprises the depositing of at least one of the previously described polymers, ceramics, and metals near the intersecting points of carbon nanotubes within the nano-structured material.

In addition, fusing of the materials within the nanomaterial may be performed by irradiative, electrical, chemical, thermal, or mechanical processing, either independently or in conjunction with one another. For example, irradiative processing may comprise e-beam irradiation, UV radiation, X-ray, gamma ray, beta radiation, and ionizing radiation. Chemical processing may comprise treating the carbon nanotubes with at least one material chosen from acids, bases, peroxides, and amines for a time sufficient to facilitate fusion of the carbon nanotubes with one another. Similarly, chemical processing may comprise photochemical bonding for a time sufficient to obtain chemical cross linking.

When fusing occurs through a mechanical process, it can be done through a mechanical pressing of a carbon nanotube intersection with sufficient pressure to cause at least two nano-fibers to bond. According to a method described herein, the one, two and three-dimensional nanostructured material may be thermally or electromagnetically annealed to add further benefits to the structure, such as structural integrity. For example, by passing a current through or by creating eddy currents through electromagnetic field immersion one can cause electro-migration in an amount sufficient to fuse nanotubes together, which, depending on the particular conditions (including field strength, and nanotube morphology) can lead not only to the modification of such defects, but can cause defect creation, elimination or migration.

Any or all of the above-described methods can be further generalized to construct a multi-layered nanomesh material wherein each layer may be of the same or different composition from other layers within the layered material. Further, each layer may be specifically designed to provide some desired behavior to the resulting multi-layer material. In addition, some of these layers may include layers not composed of nano-material and whose presence provides mechanical, electrical, and/or thermal properties or acts to set inter-membrane spacing for the nanomesh layers.

Unless otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed:

1. A method for producing substantially aligned carbon nanotubes, said method comprising:
   depositing onto a continuously moving substrate, (1) a catalyst to initiate and maintain the growth of carbon nanotubes, and (2) a carbon-bearing precursor, growing nanotubes inside of a chemical vapor deposition (CVD) reactor at conditions that promote the growth of substantially aligned carbon nanotubes on the catalyst support material; and
   heating said moving substrate prior to depositing said catalyst thereon, said heating for removing contaminants therefrom,
   wherein the carbon-bearing precursor is preheated by a delivery manifold prior to being introduced into the CVD reactor.

2. A method for producing substantially aligned carbon nanotubes, said method comprising:
   depositing onto a continuously moving substrate, (1) a catalyst to initiate and maintain the growth of carbon nanotubes, and (2) a carbon-bearing precursor, growing nanotubes inside of a chemical vapor deposition (CVD) reactor at conditions that promote the growth of substantially aligned carbon nanotubes on the catalyst support material; and
   heating said moving substrate prior to depositing said catalyst thereon, said heating for removing contaminants therefrom,
   wherein said conditions that promote the growth of substantially aligned carbon nanotubes include the deposition of carbon bearing precursor at a flow rate per unit substrate surface ranging from 10 ml/(cm$^2$min) to 400 ml/(cm$^2$min).

3. A method for producing substantially aligned carbon nanotubes, said method comprising:
   depositing onto a continuously moving substrate, (1) a catalyst to initiate and maintain the growth of carbon nanotubes, and (2) a carbon-bearing precursor, growing nanotubes inside of a chemical vapor deposition (CVD) reactor at conditions that promote the growth of substantially aligned carbon nanotubes on the catalyst support material; and
   heating said moving substrate prior to depositing said catalyst thereon, said heating for removing contaminants therefrom,
   wherein said catalyst comprises a particle having diameter ranging from 0.7 nm and 50nm.

4. A method for producing substantially aligned carbon nanotubes, said method comprising:
   depositing onto a continuously moving substrate, (1) a catalyst to initiate and maintain the growth of carbon nanotubes, and (2) a carbon-bearing precursor, growing nanotubes inside of a chemical vapor deposition (CVD) reactor at conditions that promote the growth of substantially aligned carbon nanotubes on the catalyst support material; and
   heating said moving substrate prior to depositing said catalyst thereon, said heating for removing contaminants therefrom,
   wherein said continuously moving substrate is moving at a speed sufficient to produce said carbon nanotubes to a length ranging from 100 um to 20 cm.

5. A method for producing substantially aligned carbon nanotubes, said method comprising:
   depositing onto a semi-continuous or continuously moving substrate: (1) a catalyst to initiate and maintain the growth of carbon nanotubes, said catalyst comprising iron, cobalt, nickel, platinum, lead, palladium, copper, gold, or any combination or alloy thereof; and (2) a carbon-bearing precursor at a flow rate per unit substrate surface ranging from 10 ml/(cm$^2$min) to 400 ml/(cm$^2$min), growing nanotubes inside of a chemical vapor deposition (CVD) reactor at a temperature ranging from 600 to 1,100 degrees Celsius, wherein said substrate comprises a flexible or rigid tape, wire, ribbon, cylindrical, or ring substrate of platinum, palladium, iridium, iron, cobalt, nickel, chromium, carbon, silicon, aluminum, magnesium carbon, combinations, alloys or oxides thereof; and
   heating said moving substrate prior to depositing said catalyst thereon, said heating for removing contaminants therefrom.

* * * * *